United States Patent
Sim et al.

(10) Patent No.: US 12,163,036 B2
(45) Date of Patent: Dec. 10, 2024

(54) INK COMPOSITION, LIGHT-EMITTING APPARATUS USING INK COMPOSITION, AND METHOD OF MANUFACTURING LIGHT-EMITTING APPARATUS

(71) Applicant: Samsung Display Co., Ltd., Yongin-si (KR)

(72) Inventors: Junbo Sim, Yongin-si (KR); Hyojin Ko, Yongin-si (KR); Dukki Kim, Yongin-si (KR); Jonghyuk Kang, Yongin-si (KR); Changhee Lee, Yongin-si (KR); Jaehoon Jung, Yongin-si (KR); Jaekook Ha, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 482 days.

(21) Appl. No.: 17/025,399

(22) Filed: Sep. 18, 2020

(65) Prior Publication Data

US 2021/0238435 A1    Aug. 5, 2021

(30) Foreign Application Priority Data

Jan. 31, 2020    (KR) .................. 10-2020-0012192

(51) Int. Cl.
  *C09D 11/36* (2014.01)
  *C08G 69/48* (2006.01)
  (Continued)

(52) U.S. Cl.
  CPC .............. *C09D 11/36* (2013.01); *C08G 69/48* (2013.01); *C08L 75/16* (2013.01); *C09D 11/326* (2013.01); *H01L 31/18* (2013.01)

(58) Field of Classification Search
  CPC ..... C09D 11/36; C09D 11/326; C09D 11/322; C09D 11/52; C09D 11/30; C09D 11/50;
  (Continued)

(56) References Cited

U.S. PATENT DOCUMENTS 5,319,055 A * 6/1994 Sperry .................. C09D 7/43
                                                  524/427
5,496,908 A * 3/1996 Bostrom .............. C09D 7/43
                                                  528/74.5
(Continued)

FOREIGN PATENT DOCUMENTS

CN    1637083    7/2005
CN    103594460    2/2014
(Continued)

OTHER PUBLICATIONS

"Product Stability or Shelf Life—What Rheology Has to Do With It", Oldörp, p. 1-2, accessed Nov. 28, 2022, https://tools.thermofisher.com/content/sfs/brochures/V260-e-Product_Stability_or_Shelf_Life__What_Rheology_Has_to_Do_with_it.pdf ( Year: 2012).*

(Continued)

*Primary Examiner* — Jennifer A Smith
*Assistant Examiner* — Jeffrey Eugene Barzach
(74) *Attorney, Agent, or Firm* — KILE PARK REED & HOUTTEMAN PLLC

(57) ABSTRACT

Provided are an ink composition, a light-emitting apparatus using the ink composition, and a method of manufacturing the light-emitting apparatus. The ink composition may include a light-emitting device, a solvent, and an organic thickener, and the organic thickener is a polymeric compound including at least one group represented by Formula 1:

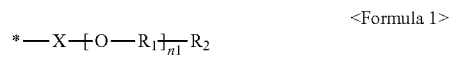

<Formula 1> wherein in Formula 1, X, $R_1$, n1, and $R_2$ may respectively be understood by referring to the descriptions of X, $R_1$, n1, and $R_2$ provided in the detailed description.

19 Claims, 3 Drawing Sheets

(51) Int. Cl.
*C08L 75/16* (2006.01)
*C09D 11/326* (2014.01)
*H01L 31/18* (2006.01)

(58) Field of Classification Search
CPC ......... C09D 11/03; C08G 69/48; C08L 75/16; C08L 71/00; H01L 31/18; H01L 25/0753; H01L 33/62; H01L 33/0095; H01L 33/20; H01L 33/36; H01L 2933/0016; H01L 51/0005; H01L 51/56; B41J 2/01; B41M 3/003; C08K 5/06
See application file for complete search history.

(56) References Cited

U.S. PATENT DOCUMENTS

| | | | | |
|---|---|---|---|---|
| 6,043,300 | A | * | 3/2000 | Santhanam ........ C08G 18/3275 524/307 |
| 8,314,544 | B2 | | 11/2012 | Ju |
| 9,309,461 | B2 | | 4/2016 | Sato |
| 9,884,992 | B2 | | 2/2018 | Choi et al. |
| 2006/0106153 | A1 | * | 5/2006 | Blankenship ........ C08G 18/792 524/500 |
| 2014/0051237 | A1 | * | 2/2014 | Lockett ........... H01L 31/035218 252/500 |
| 2014/0145237 | A1 | | 5/2014 | Do et al. |
| 2015/0349206 | A1 | * | 12/2015 | Lowenthal ............. H10K 71/00 257/459 |
| 2016/0280947 | A1 | | 9/2016 | Hao et al. |
| 2017/0090248 | A1 | | 3/2017 | Yoneyama et al. |
| 2018/0019369 | A1 | * | 1/2018 | Cho ......................... H05K 1/11 |
| 2018/0100079 | A1 | | 4/2018 | Liu |
| 2018/0215856 | A1 | * | 8/2018 | Ruhlmann ............... C09D 7/43 |
| 2018/0237691 | A1 | * | 8/2018 | Pan ........................ C09D 11/36 |
| 2021/0017413 | A1 | * | 1/2021 | Tsuruta ................ C09K 11/025 |

FOREIGN PATENT DOCUMENTS

| | | | | |
|---|---|---|---|---|
| CN | 103608937 | | 2/2014 | |
| CN | 103633222 | | 3/2014 | |
| CN | 109863427 | A * | 6/2019 | ............. B32B 17/06 |
| EP | 1 541 643 | | 6/2005 | |
| JP | 2010219508 | A * | 9/2010 | |
| JP | 2016-519700 | | 7/2016 | |
| JP | 2019081868 | A * | 5/2019 | |
| JP | 2019172951 | A * | 10/2019 | |
| KR | 10-2005-0101101 | | 10/2005 | |
| KR | 10-0621916 | | 9/2006 | |
| KR | 10-1005393 | | 12/2010 | |
| KR | 10-2013-0117766 | | 10/2013 | |
| KR | 10-2014-0054321 | | 5/2014 | |
| KR | 10-1525770 | | 6/2015 | |
| KR | 10-2016-0147857 | | 12/2016 | |
| KR | 10-2018-0007376 | | 1/2018 | |
| WO | 2008/064966 | | 6/2008 | |

OTHER PUBLICATIONS

English Machine Translation for JP2019081868A ("Machine_Translation_Kimura_JP_2019081868_A") (Year: 2019).*
Fonnum, G., Bakke, J. & Hansen, F.K. Associative thickeners. Part I: Synthesis, rheology and aggregation behavior. Colloid Polym Sci 271, 380-389 (1993). https://doi.org/10.1007/BF00657419 (Year: 1993).*
English machine translation of JP-2010219508-A (Year: 2010).*
English machine translation of CN-109863427-A (Year: 2019).*
English machine translation of JP-2019172951-A (Year: 2019).*
"Thickening and Thixotropy Agents—additives by Deuteron", Deuteron Additives to Your Success, Apr. 24, 2020, https://www.deuteron.com/en/product-category/thickening-and-thixotropy-agents/kategorie/thickening-and-thixotropy-agents/.
Aditya Jaishankar et al., "Probing Hydrogen Bond Interactions in a Shear Thickening Polysaccharide using Nonlinear Shear and Extensional Rheology", Carbohydrate Polymers, Jun. 5, 2015, pp. 136-145, vol. 123.
Chinese Office Action for Chinese Patent Application No. 202011484529.7, dated May 24, 2023.

* cited by examiner

INK COMPOSITION, LIGHT-EMITTING APPARATUS USING INK COMPOSITION, AND METHOD OF MANUFACTURING LIGHT-EMITTING APPARATUS

CROSS-REFERENCE TO RELATED APPLICATION(S)

This application claims priority to and benefits of Korean Patent Application No. 10-2020-0012192, filed on Jan. 31, 2020 in the Korean Intellectual Property Office, the entire contents of which are incorporated herein by reference.

BACKGROUND

1. Technical Field

Embodiments relate to an ink composition, a light-emitting apparatus using the ink composition, and a method of manufacturing the light-emitting apparatus.

2. Description of the Related Art

Light-emitting devices (LEDs) have high light conversion efficiency, consume very little energy, and are semi-permanent and eco-friendly. In order to utilize LEDs as lighting or a display device, it is necessary to connect LEDs between a pair of electrodes capable of applying power to the LEDs. A method of connecting LEDs to electrodes may be classified into either a method of directly growing LEDs on a pair of electrodes or a method of arranging LEDs after separately growing the LEDs. In the latter method, a solution process may be used as a method of inputting LEDs on electrodes. For example, LEDs may be input on electrodes by using a slit coating method or an inkjet printing method.

An ink composition used in the solution process needs to enable stable application and ejection, without causing phase separation between functional materials such as LEDs and solvents. When forming a film, the ink composition should also allow formation of a uniform film. In particular, the dispersion stability of an LED ink is important in uniformly inputting LEDs onto electrodes. Due to a relatively high specific gravity of LEDs, LED sedimentation may be caused in the ink composition, which may degrade the uniformity of a film formed by the solution process. In addition, clogging of the coater and the print head may be caused by the LEDs agglomerated in the ink, thereby deteriorating processability.

SUMMARY

Embodiments include an ink composition with improved dispersion stability and ejection stability by including an organic thickener having thixotropic properties.

Aspects of the embodiments will be set forth in part in the description which follows and, in part, will be apparent from the description, or may be learned by practice of the embodiments of the disclosure.

In embodiments, an ink composition may include a light-emitting device, a solvent, and an organic thickener,
wherein the organic thickener may be a polymeric compound including at least one group represented by Formula 1:

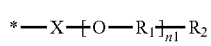
<Formula 1> wherein in Formula 1,
X may be a single bond or a divalent organic linking group,
$R_1$ may be a substituted or unsubstituted $C_1$-$C_{10}$ alkylene group,
$R_2$ may be selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group,
n1 may be an integer from 2 to 100, and
* indicates a binding site of the polymeric compound.

According to embodiments, the organic thickener may include the at least one group represented by Formula 1 in at least one selected from a side chain of the polymeric compound and a terminus of the polymeric compound.

According to embodiments, the organic thickener may include the at least one group represented by Formula 1 in a terminus of the polymeric compound.

According to embodiments, the polymeric compound may include at least one of a polyurethane unit, a polyamide unit, and a polyurea unit.

According to embodiments, in Formula 1, $R_2$ may be a $C_1$-$C_{20}$ alkyl group in which a hydroxyl group is substituted at a terminus or a $C_1$-$C_{20}$ alkyl ether group in which a hydroxyl group is substituted at a terminus.

According to embodiments, in Formula 1, $R_2$ may be a group represented by Formula 2:

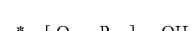
<Formula 2> wherein in Formula 2,
$R_{21}$ may be a substituted or unsubstituted $C_1$-$C_{10}$ alkylene group,
m1 may be an integer from 1 to 10, and
* indicates a binding site to an adjacent atom.

According to embodiments, the organic thickener may be a polymeric compound including at least one group represented by Formula 3:

<Formula 3> wherein in Formula 3,
X may be a single bond or a divalent organic linking group,
$R_1$ and $R_{21}$ may each independently be a substituted or unsubstituted $C_1$-$C_{10}$ alkylene group,
n1 may be an integer from 2 to 100,
m1 may be an integer from 1 to 10, and
* indicates a binding site of the polymeric compound.

According to embodiments, a number average molecular weight (Mn) of the organic thickener may be in a range of about 100 to about 100,000, and a weight average molecular weight (Mw) of the organic thickener may be in a range of about 1,500 to about 1,000,000.

According to embodiments, the light-emitting device may include a first semiconductor layer, a second semiconductor layer, and an active layer between the first semiconductor layer and the second semiconductor layer.

According to embodiments, the light-emitting device may further include a first electrode layer under the first semiconductor layer and a second electrode layer over the second semiconductor layer.

According to embodiments, the light-emitting device may have a cylindrical shape.

According to embodiments, a diameter of the light-emitting device may be in a range of about 0.1 micrometers (μm) to about 1 μm, and a length of the light-emitting device may be in a range of about 1 μm to about 10 μm.

According to embodiments, the solvent may include a functional group that may be hydrogen-bonded to the organic thickener.

According to embodiments, the solvent may include at least one of alkylene glycol alkyl ether solvent, diethylene glycol monoalkyl ether solvent, diethylene glycol dialkyl ether solvent, triethylene glycol monoalkyl ether solvent, triethylene glycol dialkyl ether solvent, aromatic ether solvent, alkylene glycol alkyl ether acetate solvent, alkoxy alkyl acetate solvent, ketone solvent, alcohol solvent, ester solvent, and cyclic ester solvent.

According to embodiments, a content of the organic thickener may be in a range of about 0.05 percent by weight (wt %) to about 1 wt %, based on the total weight of the ink composition.

According to embodiments, a content of the light-emitting device may be in a range of about 0.01 wt % to about 1 wt %, based on the total weight of the ink composition.

According to embodiments, the ink composition may further include a dispersant, and a content of the dispersant in the ink composition may be in a range of about 10 parts to about 50 parts by weight, based on 100 parts by weight of the light-emitting device.

According to embodiments, a viscosity at a shear rate of 0.1 reciprocal seconds ($s^{-1}$) may be in a range of about 30 centipoises (cP) to about 1,000 cP, and a viscosity at a shear rate of 100 $s^{-1}$ may be in a range of about 7 cP to about 13 cP.

According to embodiments, a method of manufacturing a light-emitting apparatus may include providing a substrate including an emission area in which a first electrode and a second electrode may be spaced apart from each other;
providing the ink composition onto the emission area to input the light-emitting device in the emission area; and
arranging the light-emitting device at an area of the first electrode and at an area of the second electrode to dispose the light-emitting device between the first electrode and the second electrode.

According to embodiments, the providing of the ink composition onto the emission area may be performed by an inkjet printing method.

BRIEF DESCRIPTION OF THE DRAWINGS

The above and other aspects, features, and advantages of embodiments of the disclosure will be more apparent from the following description taken in conjunction with the accompanying drawings, in which.

DETAILED DESCRIPTION OF THE EMBODIMENTS

Figure 1:
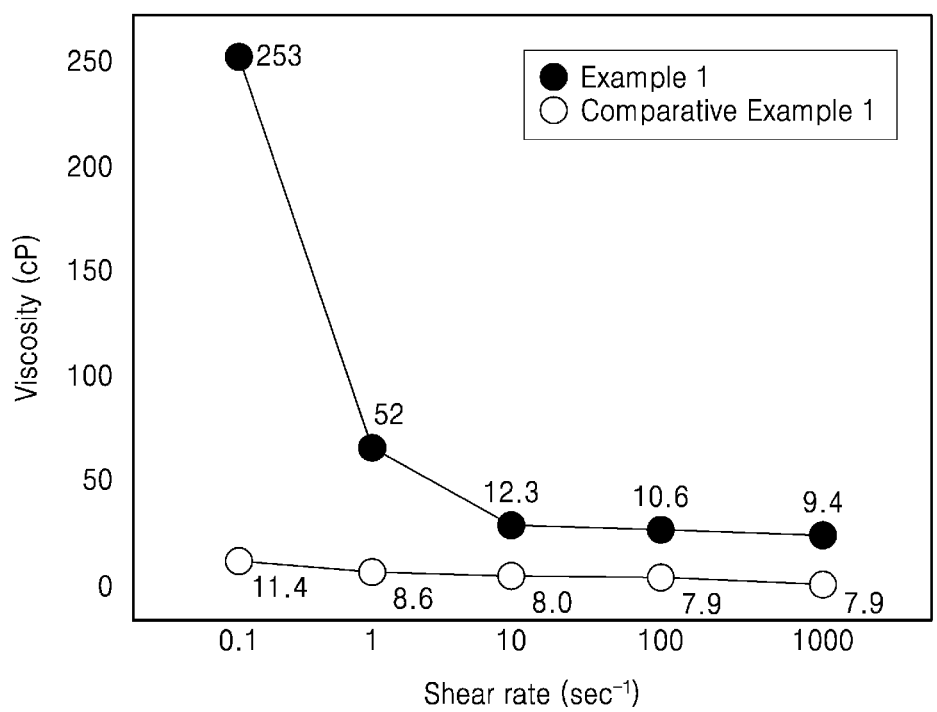
FIG. 1 is a graph of viscosity (centipoise, cP) versus shear rate (reciprocal seconds, $s^{-1}$) of the ink compositions prepared in Example 1 and Comparative Example 1.

Reference will now be made in detail to embodiments, which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the detailed description.

As used herein, the term "and/or" includes any and all combinations of one or more of the associated listed items. For example, "A and/or B" may be understood to mean A, B, or A and B. The terms "and" and "or" may be used in the conjunctive or disjunctive sense and may be understood to be equivalent to "and/or".

The phrase "at least one of" is intended to include the meaning of "at least one selected from" for the purpose of its meaning and interpretation. For example, "at least one of A and B" may be understood to mean A, B, or A and B. When preceding a list of elements, the term, "at least one of," modifies the entire list of elements and does not modify the individual elements of the list.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Hereinafter, the inventive concept will be described in detail by explaining example embodiments of the inventive concept with reference to the attached drawings. Like reference numerals in the drawings denote like elements, and thus their description will be omitted.

In the embodiments described in the specification, an expression used in the singular encompasses the expression of the plural, unless it has a clearly different meaning in the context.

In the specification, it is to be understood that the terms such as "including," "having," and "comprising" are intended to indicate the existence of the features or components disclosed in the specification, and are not intended to preclude the possibility that one or more other features or components may exist or may be added.

It will be understood that when a layer, region, or component is referred to as being "on" or "onto" another layer, region, or component, it may be directly or indirectly formed over the other layer, region, or component. For example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

In the specification, the term "room temperature" means about 25° C.

[Ink Composition]

While not wishing to be bound by theory, a particle surface modifier or a dispersant may allow an ink composition that includes a light-emitting device to properly disperse the light-emitting device in a solvent. However, even after dispersion is properly performed, when the light-emitting device has a relatively high specific gravity, sedimentation of the dispersed light-emitting device may occur due to gravity. Accordingly, the dispersibility of the ink composition may be lowered, and phase separation between the light-emitting device and the solvent in the composition may occur.

When a light-emitting apparatus is manufactured by a solution process using such an ink composition, a non-uniform film may be formed, resulting in a problem where luminescence efficiency and luminescence uniformity are lowered. Agglomeration of particles in the vicinity of a nozzle of equipment used in the solution process, such as an inkjet printer, may also occur, thus deteriorating processability.

To resolve the foregoing problem, an ink composition according to embodiments may include an organic thickener having thixotropic properties.

Accordingly, an ink composition according to embodiments may include a light-emitting device, a solvent, and an organic thickener, wherein the organic thickener may be a polymeric compound including at least one group represented by Formula 1:

<Formula 1> wherein, in Formula 1,

X may be a single bond or a divalent organic linking group, $R_1$ may be a substituted or unsubstituted $C_1$-$C_{10}$ alkylene group, $R_2$ may be selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group, n1 may be an integer from 2 to 100,

* indicates a binding site of the polymeric compound.

According to embodiments, X may be a single bond.

According to embodiments, when X is a divalent organic linking group, the divalent organic linking group may be selected from a substituted or unsubstituted $C_1$-$C_{20}$ alkylene group, a substituted or unsubstituted a $C_1$-$C_{20}$ alkylene group in which at least one methylene (—$CH_2$—) is substituted with sulfonyl (—$SO_2$—), carbonyl (CO), ether (—O—), sulfide (—S—), sulfoxide (—SO—), ester (—C(=O)O—), amide (—C(=O)NR—)(wherein R may be hydrogen or a $C_1$-$C_{10}$ alkyl group), or any combination thereof, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group.

At least one substituent of the substituted $C_1$-$C_{20}$ alkylene group, the substituted $C_2$-$C_{20}$ alkenylene group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, and the substituted $C_1$-$C_{60}$ alkyl ether group may be selected from:

deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$); and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ may each independently be selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

In Formula 1, n1 may be the repeating number of a group represented by —[O—$R_1$]—, and at least two —[O—$R_1$]-(s) may be identical to or different from each other.

According to embodiments, $R_2$ may be a $C_1$-$C_{20}$ alkyl group in which a hydroxyl group is substituted or a $C_1$-$C_{20}$ alkyl ether group in which a hydroxyl group is substituted. According to embodiments, $R_2$ may be a $C_1$-$C_{20}$ alkyl group in which a hydroxyl group is substituted at a terminus or a $C_1$-$C_{20}$ alkyl ether group in which a hydroxyl group is substituted at a terminus.

In embodiments, $R_2$ may be a group represented by Formula 2:

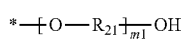

<Formula 2> wherein in Formula 2, $R_{21}$ may be a substituted or unsubstituted $C_1$-$C_{10}$ alkylene group, m1 may be an integer from 1 to 10, and

* indicates a binding site to an adjacent atom.

According to embodiments, the organic thickener may be a polymeric compound including at least one group represented by Formula 3:

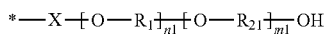

<Formula 3> wherein in Formula 3,

X, $R_1$, $R_{21}$, n1, and m1 may respectively be understood by referring to the descriptions of X, $R_1$, $R_{21}$, n1, and m1 provided herein.

According to embodiments, the organic thickener may be a polymeric compound including the group represented by Formula 1 in at least one selected from a side chain of the polymeric compound and a terminus of the polymeric compound. For example, the organic thickener may include the group represented by Formula 1 in a terminus of the polymeric compound.

The polymeric compound may include at least one of a polyurethane unit, a polyamide unit, and a polyurea unit. For example, the polymeric compound may include polyurethane-polyurea or polyamide-polyurea.

In embodiments, the organic thickener may be a terminus-modified polyurethane, a terminus-modified polyamide, or a terminus-modified polyurea, each having a terminal structure represented by Formula 1.

In embodiments, the organic thickener may be a urea-modified polyurethane or a urea-modified polyamide including the group represented by Formula 1 in a terminus thereof.

The organic thickener may include compounds such as RHEOBYK-430 and RHEOBYK-410 (available from BYK, Germany), but embodiments are not limited thereto.

A number average molecular weight (Mn) of the organic thickener may be in a range of about 100 to about 100,000.

A weight average molecular weight (Mw) of the organic thickener may be in a range of about 1,500 to about 1,000,000.

The organic thickener may impart high dispersion stability to the ink composition in a storage state by including at least one group represented by Formula 1. For example, as compared with an ink composition that does not include the organic thickener, the ink composition according to an embodiment may maintain appropriate viscosity such that light-emitting devices do not aggregate, and the storage period in which the dispersion degree may be maintained may be significantly prolonged.

The organic thickener may be capable of reversibly associating between organic thickener molecules or with different molecules. Since the organic thickener has thixotropic properties, the organic thickener may impart excellent viscosity and thixotropic properties to the ink composition.

While not wishing to be bound by theory, the organic thickener may interact with each other or with different molecules via a hydrogen bond. For example, the interaction force of the organic thickener may be a hydrogen bond.

As the ink composition includes the organic thickener, the ink composition may have excellent dispersion stability in a storage state, and may also improve processability since the viscosity of the ink composition decreases under high-shear conditions (e.g., during inkjet ejection) when the ink composition is applied to a solution process.

[Light-Emitting Device]

The light-emitting device may be a nano light-emitting device (nano LED), which is a light-emitting device having a size of nano-scale or a micro light-emitting device (micro LED), which is a light-emitting device having a size of micro-scale.

The light-emitting device may include a first semiconductor layer, a second semiconductor layer, and an active layer between the first semiconductor layer and the second semiconductor layer.

The first semiconductor layer, the active layer, and the second electrode layer may be sequentially stacked in a longitudinal direction of the light-emitting device.

For example, the first semiconductor layer may include an n-type semiconductor, and the second semiconductor layer may include a p-type semiconductor. Each semiconductor layer may include a semiconductor material having an empirical formula of $In_xAl_yGa_{1-x-y}N$ (wherein $0 \le x \le 1$, $0 \le y \le 1$, and $0 \le x+y \le 1$), for example, a semiconductor material such as GaN, AlN, AlGaN, InGaN, InN, InAlGaN, and AlInN.

The first semiconductor layer may be doped with an n-type dopant such as Si, Ge, or Sn, and the second semiconductor layer may be doped with a p-type dopant such as Mg, Zn, Ca, Sr, or Ba, but embodiments are not limited thereto.

In embodiments, the first semiconductor layer may include a p-type semiconductor, and the second semiconductor layer may include an n-type semiconductor.

The active layer may be between the first semiconductor layer and the second semiconductor layer, and the active layer may have a single or multiple quantum well structure. When the active layer has a multiple quantum well structure, quantum layers and well layers may be alternately stacked with each other. The active layer is a region in which an electron and a hole are recombined. As an electron and a hole are recombined, transition to a low energy level may occur, thus generating light having a wavelength corresponding thereto. The active layer may be used without limitation as long as the active layer is an active layer included in a typical LED device used for lighting, display, and the like. The active layer may be disposed differently according to the type of light-emitting diode.

The invention is not limited to the above-described embodiments. For example, the light-emitting device may include separate fluorescent layers, active layers, semiconductor layers, electrode layers, or any combination thereof on at least one of the upper portion of the first semiconductor layer and the lower portion of the second semiconductor layer. Light generated from the active layer may be emitted to an outer surface and/or lateral surfaces of the light-emitting device. For example, light generated from the active layer may be emitted to the longitudinal outer surface and/or lateral surfaces of the light-emitting device.

According to embodiments, the light-emitting device may further include a first electrode layer under the first semiconductor layer and a second electrode layer over the second semiconductor layer.

The first electrode layer and the second electrode layer may each be an ohmic contact electrode. However, the first electrode layer and the second electrode layer are not limited thereto, and the first electrode layer and the second electrode layer may each be a Schottky contact electrode. The first electrode layer and the second electrode layer may include, for example, at least one metal such as aluminum, titanium, indium, gold, and silver. Materials included in the first electrode layer and the second electrode layer may be identical to or different from each other.

The light-emitting device may further include an insulating layer surrounding an outer surface of the light-emitting device. The insulating layer may prevent a decrease in luminescence efficiency by protecting an outer surface of the light-emitting device including an outer surface of the active layer. The insulating layer may cover the entire outer surface of the light-emitting device or only a part of the outer surface of the light-emitting device. The insulating layer may be formed to expose both ends of the light-emitting device in the longitudinal direction.

The light-emitting device may have various shapes such as a cylindrical shape or a cuboid shape. In embodiments, the light-emitting device may have a cylindrical shape.

For example, a diameter of the light-emitting device may be in a range of about 0.1 micrometers (μm) to about 1 μm, and a length of the light-emitting device may be in a range of about 1 μm to about 10 μm, but embodiments are not limited thereto.

The light-emitting device may emit red light, green light, or blue light.

[Solvent]

The solvent is not limited as long as the solvent may properly disperse the light-emitting device and the organic thickener.

For example, the solvent may be an organic solvent.

In embodiments, the solvent may be selected from a chlorine-based solvent, an ether-based solvent, an ester-based solvent, a ketone-based solvent, an aliphatic hydrocarbon-based solvent, and an aromatic hydrocarbon-based solvent, but embodiments are not limited thereto.

In embodiments, the solvent may include dichloromethane, 1,2-dichloroethane, 1,1,2-trichloroethane, chlorobenzene, o-dichlorobenzene, cyclohexylbenzene, tetrahydrofuran, dioxane, anisol, 4-methylanisol, butylphenyl ether, toluene, xylene, mesitylene, ethylbenzene, n-hexylbenzene, cyclohexylbenzene, trimethylbenzene, tetrahydronaphthalene, cyclohexane, methylcyclohexane, n-pentane, n-hexane, n-heptane, n-octane, n-nonane, n-decane, dodecane, hexadecane, oxadecane, acetone, methylethylketone, cyclohexanone, acetophenone, ethyl acetate, butyl acetate, methyl solvacetate, ethyl solvacetate, methyl benzoate, ethyl benzoate, butyl benzoate, 3-phenoxy benzoate, or any combination thereof, but embodiments are not limited thereto.

According to embodiments, the solvent may include a functional group that may be hydrogen-bonded to the organic thickener.

As the solvent includes a functional group that may be hydrogen-bonded to the organic thickener, the organic thickener may have improved thixotropic properties.

For example, the solvent may include a hydroxyl group, a carbonyl group, an amino group, a carboxyl group, an alkoxy group, an ether group, an ester group, or any combination thereof.

For example, the solvent may include at least one selected from: alkylene glycol alkyl ether solvent such as ethylene glycol monomethyl ether, ethylene glycol monoethyl ether, ethylene glycol monopropyl ether, ethylene glycol monobutyl ether, propylene glycol monomethyl ether, or propylene glycol methylethyl ether; diethylene glycol monoalkyl ether solvent; diethylene glycol dialkyl ether solvent such as diethylene glycol dimethyl ether, diethylene glycol diethyl ether, diethylene glycol dipropyl ether, or diethylene glycol dibutyl ether; triethylene glycol monoalkyl ether solvent such as triethylene glycol monomethyl ether, triethylene glycol monoethyl ether, triethylene glycol monopropyl ether, or triethylene glycol monobutyl ether; triethylene glycol dialkyl ether solvent such as triethylene glycol dimethyl ether, triethylene glycol diethyl ether, triethylene glycol dipropyl ether, or triethylene glycol dibutyl ether; aromatic ether solvent such as ethylene glycol monophenyl ether or diethylene glycol monophenyl ether; alkylene glycol alkyl ether acetate solvent such as methyl cellosolve acetate, ethyl cellosolve acetate, propylene glycol monomethyl ether acetate, propylene glycol monoethyl ether acetate, or propylene glycol monopropyl ether acetate; alkoxy alkyl acetate solvent such as methoxybutyl acetate or methoxypentyl acetate; ketone solvent such as methyl ethyl ketone, acetone, methyl amyl ketone, methyl isobutyl ketone, or cyclohexanone; alcohol solvent such as ethanol, propanol, butanol, hexanol, cyclohexanol, ethylene glycol, or glycerin; ester solvent such as ethyl 3-ethoxypropionate or methyl 3-methoxypropionate; and cyclic esters such as γ-butyrolactone.

In some embodiments, the solvent may be diethylene glycol monophenyl ether.

The solvent may be used alone or in a combination of at least two.

When the ink composition includes, for example, a terminus-modified polyamide having a terminal structure represented by Formula 1 as an organic thickener and an alkylene glycol alkyl ether solvent as a solvent, the organic thickener molecules may interact with the solvent molecules through hydrogen bonding between a —NH group in the polymer chain and a carbonyl group in the solvent. In addition, since the organic thickener and the solvent also form a hydrogen bond, the organic thickener molecules and the solvent molecules may be physically crosslinked by hydrogen bonding to each other to form a three-dimensional reversible network structure in the ink composition. The three-dimensional network structure of the ink composition may be maintained in a storage state where no external force is applied, but when an external force is applied to the ink composition, hydrogen bonds between molecules may be broken, and the three-dimensional network structure may be disassembled. Accordingly, the ink composition may have thixotropic properties.

Therefore, the ink composition may maintain a high viscosity when no external force is applied to the ink composition, for example, in a storage state with a low shear (substantially a shear rate of 0), and light-emitting devices dispersed in the ink composition may be prevented from sedimentation. On the other hand, when an external force is applied to the ink composition, for example, under high shear conditions, hydrogen bonding between organic molecules may be broken, and the viscosity of the ink composition may be lowered due to collapse of the network structure.

Accordingly, the ink composition according to embodiments may have high dispersion stability in a storage state and prevent sedimentation of light-emitting devices dispersed in the ink composition, and may also have a low viscosity under high shear conditions so as to be suitable for application in a solution process.

A content of the organic thickener in the ink composition may be in a range of about 0.05 percent by weight (wt %) to about 1 wt % based on the total weight of the ink composition. For example, the content of the organic thickener in the ink composition may be in a range of about 0.1 wt % to about 0.5 wt %, based on the total weight of the ink composition. When the above-described range is satisfied, the ink composition may have a sufficient viscosity in a storage state to be uniformly dispersed in the composition and prevent sedimentation of the light-emitting device.

When the organic thickener is included in the ink composition in an amount of less than about 0.05 wt %, the viscosity of the ink composition may not be sufficient, resulting in sedimentation of the light-emitting device. On the other hand, when the organic thickener is included in excess of 1 wt % in the ink composition, gelation of the ink composition may be caused. Thus, the formation of the ink composition may not be suitable for use in a solution process, for example, use in ejecting in the inkjet printing method.

A content of the light-emitting device may be in a range of about 0.01 wt % to about 1 wt %, based on the total weight of the ink composition. When the content of the light-emitting device is within this range, the ink composition may be suitable for manufacturing light-emitting apparatus having sufficient luminescence efficiency by a solution process. When a content of the light-emitting device in the ink composition is less than about 0.01 wt %, and a light-emitting apparatus is manufactured using the ink composition, the number of light-emitting devices connected to electrodes may be small, and thus, it may be difficult to obtain sufficient luminescence efficiency. A problem of dropping solution several times may occur.

A content of the solvent in the ink composition may be in a range of about 80 wt % to about 99.9 wt %, based on the total weight of the ink composition. For example, the content of the solvent in the ink composition may be in a range of about 90 wt % to about 99.8 wt %, based on the total weight of the ink composition. However, embodiments are not limited thereto. When the content of the solvent is within this range, the light-emitting device and the organic thickener may be properly dispersed in the ink composition, and a concentration suitable for a solution process may be obtained.

According to embodiments, a viscosity at a shear rate of 0.1 reciprocal seconds ($s^{-1}$) may be in a range of about 30 centipoises (cP) to about 1,000 cP, and a viscosity at a shear rate of 100 $s^{-1}$ may be in a range of about 7 cP to about 13 cP.

In the specification, a shear rate of 0.1 $s^{-1}$ is defined as a shear rate of a storage state. In fact, in the ink composition in a storage state, because no external force is applied, the shear rate is about 0 $s^{-1}$. However, the viscosity of 0 $s^{-1}$ cannot be measured in principle, and thus, the viscosity in a storage state as a representative value is defined as the viscosity measured at 0.1 $s^{-1}$.

In addition, a shear rate of 100 $s^{-1}$ is defined as a shear rate of a solution process applicable state. For example, in a process involving inkjet printing, a solution process applicable state means an inkjet ejecting state. For example, a shear rate in an ejection state may be determined by an ejection pressure. It is apparent to one of ordinary skill in the art that a shear rate of a solution process applicable state may be changed according to process conditions. However, in the specification, a viscosity at 100 $s^{-1}$ is defined as a representative value of the viscosity of a solution process applicable state.

When an ink composition has a viscosity within this range, the ink composition may be applicable to a solution process. For example, in a storage state, sedimentation of the light-emitting device may be prevented because the ink composition may maintain a high viscosity, and when the ink composition is applied to a solution process, the ink composition may have a low viscosity, thereby improving film uniformity and processability.

As a method of measuring the viscosity, a method commonly known to one of ordinary skill in the art may be used. For example, a rheometer (e.g., DV-I Prime Brookfield rheometer) may be used in measurement.

When a viscosity of the ink composition at a shear rate of 0.1 $s^{-1}$ is less than 30 cP, dispersion stability of the ink composition may be deteriorated, causing sedimentation of the light-emitting device and separation of a solvent. On the other hand, when a viscosity of the ink composition at a shear rate of 100 $s^{-1}$ is greater than 13 cP, the ink composition may not be suitable for use in a solution process. For example, when inkjet printing is performed, ejection stability may be lowered by deterioration of straightness of droplets.

A surface tension of the ink composition at 25° C. may be in a range of about 5 dynes/cm to about 50 dynes/cm. For example, the surface tension of the ink composition at 25° C. may be in a range of about 7 dynes/cm to about 40 dynes/cm. As a method of measuring the surface tension, a method commonly known to one of ordinary skill in the art may be used. For example, a tension meter (e.g., SITA bubble pressure tension meter) may be used in measurement.

[Dispersant]

The ink composition may further include a dispersant to improve dispersibility of the light-emitting device.

The dispersant may be used to improve the deagglomeration effect of the light-emitting device in the ink composition and to serve as a protective layer for the light-emitting device in a solution process.

The dispersant may be a resin type dispersant, such as a phosphoric acid ester-based dispersant, a urethane-based dispersant, an acrylic dispersant, or the like. In particular, the commercially available dispersant may include DISPER BYK-103, DISPER BYK-110, DISPER BYK-111, DISPER BYK-2000, DISPER BYK-2001, DISPER BYK-2011, DISPER BYK-2070, DISPER BYK-2150, DISPER BYK-160, DISPER BYK-161, DISPER BYK-162, DISPER BYK-163, DISPER BYK-164, and DISPER BYK-166 available from Byk-Chemie GmbH.

A content of the dispersant may be in a range of about 10 parts to about 50 parts by weight, based on 100 parts by weight of the light-emitting device. For example, the content of the dispersant may be in a range of about 15 parts to about 30 parts by weight, based on 100 parts by weight of the light-emitting device. When a content of the dispersant is within this range, aggregation of the light-emitting device in the ink composition may be substantially prevented, and the dispersant may serve as a protective layer for the light-emitting device in a solution process.

The ink composition may further include an adhesion promoter for increasing adhesion to a substrate, a labeling agent for improving coating properties, an antioxidant, an ultraviolet absorber, or any combination thereof, according to necessity.

The adhesion promoter may be added to enhance adhesion to a substrate. Examples of the adhesion promoter may include a silane coupling agent having a reactive substituent selected from a carboxyl group, a methacryloyl group, an isocyanate group, an epoxy group, and a combination thereof, but embodiments are not limited thereto. For example, the silane coupling agent may be trimethoxysilyl benzoate, γ-methacryloxypropyltrimethoxysilane, vinyltriacetoxysilane, vinyltrimethoxysilane, γ-isocyanatopropyl triethoxysilane, γ-glycidoxypropyltrimethoxysilane, β-(3,4-epoxycyclohexyl)ethyltrimethoxysilane, or any combination thereof.

Examples of the labeling agent include a silicone-based compound, a fluorine-based compound, a siloxane-based compound, a nonionic surfactant, an ionic surfactant, and a titanate coupling agent, but embodiments are not limited thereto. For example, the labeling agent may be a silicone-based compound, a fluorine-based compound, or any combination thereof.

Examples of the silicone-based compound include dimethyl silicone, methyl silicone, phenyl silicone, methyl phenyl silicone, alkyl-modified silicone, alkoxy-modified silicone, and polyether-modified silicone, but embodiments are not limited thereto. For example, the silicone-based compound may be dimethyl silicone, methyl phenyl silicone, or any combination thereof.

Examples of the fluorine-based compound include polytetrafluorethylene, polyvinylidene fluoride, fluoroalkyl methacrylate, perfluoropolyether, and perfluoroalkylethylene oxide, but embodiments are not limited thereto. For example, the fluorine-based compound may be polytetrafluorethylene.

Examples of the siloxane-based compound include dimethyl siloxane compound (Product No: KF96L-1, KF96L-5, KF96L-10, or KF96L-100 available from Shinetsu Silicone), but embodiments are not limited thereto.

The labeling agent may be used alone or in combination with two or more types thereof.

A content of the labeling agent may vary depending on the desired performance, and the content may be in a range of about 0.001 wt % to about 5 wt %, based on the total weight of the ink composition. For example, the content of the labeling agent may be in a range of about 0.001 wt % to about 1 wt %, based on the total weight of the ink composition. When the content of the labeling agent is within this range, flowability and uniformity of a film in the ink composition may be improved.

Since the ink composition has excellent inkjet ejection stability, the ink composition may be, for example, an inkjet ink composition, but embodiments are not limited thereto.

[Solution Process]

The ink composition may be used in the manufacture of a light-emitting apparatus by using a solution process.

The ink composition may be provided in a solution process onto a substrate including an emission area in which a first electrode and a second electrode are disposed.

The solution process may be a spin coating method, a slit coating method, a drop casting method, a casting method, a gravure coating method, a bar coating method, a roll coating method, a dip coating method, a spray coating method, a screen coating method, a flexo printing method, an offset printing method, an inkjet printing method, or a nozzle printing method, but embodiments are not limited thereto.

For example, the solution process may be performed by a spin coating method, a slit coating method, or an inkjet printing method, but embodiments are not limited thereto.

For example, the ink composition may be provided in the form of a film by a spin coating method or may be provided in the form of micro droplets by an inkjet printing method, on a substrate on which the first electrode and the second electrode are disposed.

Since the ink composition has excellent inkjet ejection stability, the ink composition may be suitably used in an inkjet printing method.

The inkjet printing method may use an inkjet printer having an inkjet head equipped with a piezo type nozzle that applies pressure depending on a voltage.

In particular, the ink composition may be ejected from the nozzle of the inkjet head to the substrate.

An ejection amount of the ink composition may be in a range of about 1 pico liter per dot (pL/dot) to about 50 pL/dot. For example, the ejection amount of the ink composition may be in a range of about 1 pL/dot to about 30 pL/dot. For example, the ejection amount of the ink composition may be in a range of about 1 pL/dot to about 20 pL/dot.

An aperture diameter of the inkjet head may be in a range of about 5 μm to about 50 μm. For example, the aperture diameter of the inkjet head may be in a range of about 10 μm to about 30 μm, to minimize clogging of the nozzle and improve ejection accuracy, but embodiments are not limited thereto.

An ejection pressure of the inkjet head may be in a range of about 1,000 s$^{-1}$ to about 10,000 s$^{-1}$, based on a shear rate, but embodiments are not limited thereto.

A temperature at the time of forming a coating film is not particularly limited. However, in view of suppressing crystallization of materials contained in the ink composition, the temperature may be in a range of about 10° C. to about 50° C. For example, the temperature may be in a range of about 15° C. to about 40° C. For example, the temperature may be in a range of about 15° C. to about 30° C. For example, the temperature may be in a range of about 20° C. to about 25° C.

[Method of Manufacturing Light-Emitting Apparatus]

The ink composition may be used in manufacture of a light-emitting apparatus.

According to embodiments, a method of manufacturing a light-emitting apparatus may include: providing a substrate including an emission area in which a first electrode and a second electrode may be spaced apart from each other; providing the ink composition according to embodiments onto the emission area to input the light-emitting device; and arranging the light-emitting device at an area of the first electrode and at an area of the second electrode to dispose the light-emitting device between the first electrode and the second electrode.

According to embodiments, the providing of the ink composition onto the emission area may be performed by an inkjet printing method, but embodiments are not limited thereto. For example, an inkjet head may be disposed on top of the emission area, and the ink composition may be ejected to input a light-emitting device on the first electrode and the second electrode.

A solvent in the ink composition may evaporate at room temperature or due to heat after the providing of the ink composition.

The light-emitting device may be arranged to be physically and/or electrically connected between the first electrode and the second electrode. For example, power may be applied to power lines connected to the first electrode and the second electrode to form an electric field between the first electrode and the second electrode. The power source may be an alternating current (AC) power source or a direct current (DC) power source having a predetermined amplitude and period.

When power is applied to the first electrode and the second electrode, dipolarity in the light-emitting device may be induced due to a non-uniform electric field formed between the first electrode and the second electrode. Accordingly, the light-emitting device may be self-aligned between the first electrode and the second electrode such that both ends of the light-emitting device may respectively contact an upper surface of the first electrode and an upper surface of the second electrode. However, the method of aligning the light-emitting device between the first electrode and the second electrode is not limited thereto.

Hereinafter, the ink composition will be described in more detail through Examples and/or Comparative Examples. However, the following Examples are intended to specifically illustrate or describe embodiments and do not limit the scope of the disclosure.

EXAMPLES

Example 1

(1) Manufacture of Light-Emitting Device

A light-emitting device was manufactured by sequentially depositing n-doped GaN doped with n-type Si, an emission layer, and p-doped GaN doped with p-type Mg on a wafer to grow and separate a light-emitting device (LED).

(2) Preparation of First Dispersant

A first mixed solution was prepared by mixing a light-emitting device (0.05 wt %), BYK-161 (0.01 wt %) as a dispersant, and diethylene glycol monophenyl ether (99.94 wt %) as a solvent as follows. The dispersant was added in a solution with a concentration of 1 wt % in solvent.

The first mixed solution was sonicated in a bath for 20 minutes to prepare a first dispersion.

(3) Preparation of Ink Composition

A second mixed solution was prepared by adding RHEOBYK-430 (available from BYK) (1 wt % of solution in a solvent) as an organic thickener to the first dispersion such that a concentration in the second mixed solution was 0.2 wt %. The second mixed solution was sonicated in a bath for 20 minutes, followed by intensely stirring at 60 C° for 30 minutes. Subsequently, the temperature was lowered to room temperature and intensely stirred for 30 minutes to thereby prepare an ink composition.

Comparative Example 1

An ink composition was prepared in substantially the same manner as in Example 1, except that an organic thickener was not added in preparation of the ink composition.

Evaluation Example 1: Evaluation of Viscosity

The viscosity of each of the ink compositions prepared in Example 1 and Comparative Example 1 was measured at a shear rate of 0.1 $s^{-1}$ to 1,000 $s^{-1}$ according to a rotational viscosity measurement method. The results thereof are shown in FIG. 1. As measurement equipment, a rotational viscometer DV-I Prime Brookfield rheometer was used. The average values thereof obtained from results of five times of measurement are shown. The results of measurement are shown in FIG. 1.

As shown in FIG. 1, the ink composition according to Example 1 had a high viscosity of 253 cP at a shear rate of 0.1 $s^{-1}$ and a low viscosity of 9.4 cP at a shear rate of 1,000 $s^{-1}$. That is, the ink composition of Example 1 was found to have excellent dispersion stability in a storage state and a low viscosity in a high shear condition.

Evaluation Example 2: Evaluation of Dispersion Stability 20 mL of each of the ink compositions of Example 1 and Comparative Example 1 was filled in a vial to prepare a sample. The samples were stored for 24 hours at a constant temperature of 25° C. to observe layer separation with a naked eye. After layer separation, the volume of Supernatant (A) in which the solvent was separated and the volume of Dispersion (B) in which the solvent was not separated were observed, and the volume of Dispersion (B) in the total volume of the ink composition was converted to a percentage. The results thereof are shown in FIGS. 2A and 2B.

Figure 2A:
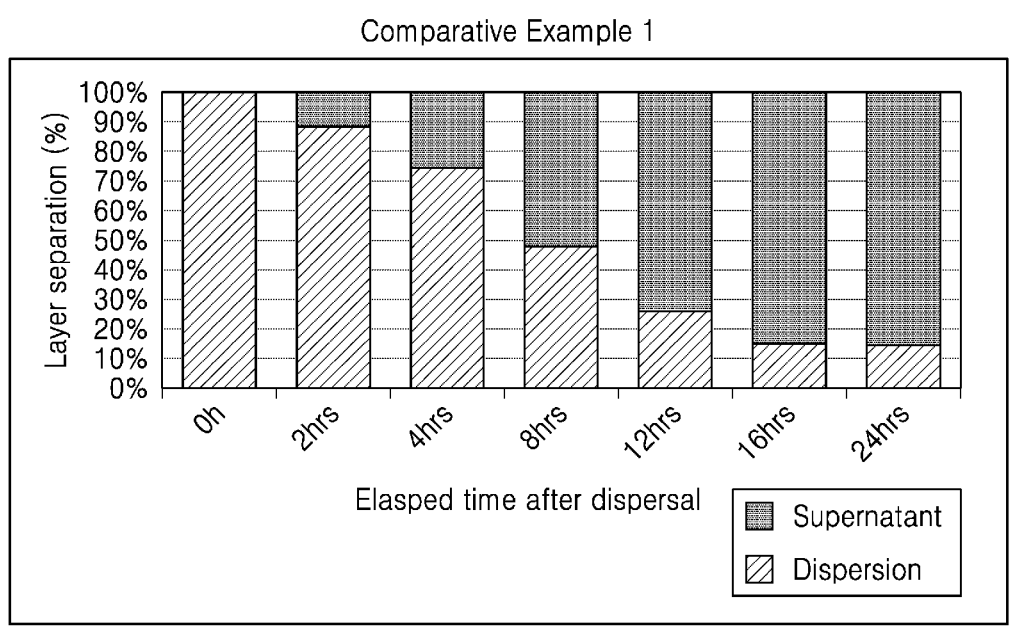
FIGS. 2A and 2B are bar graphs of degree of layer separation (percent, %) versus elapsed time (hours) after dispersal of the ink compositions prepared in Comparative Example 1 and Example 1, respectively.
Figure 2B:
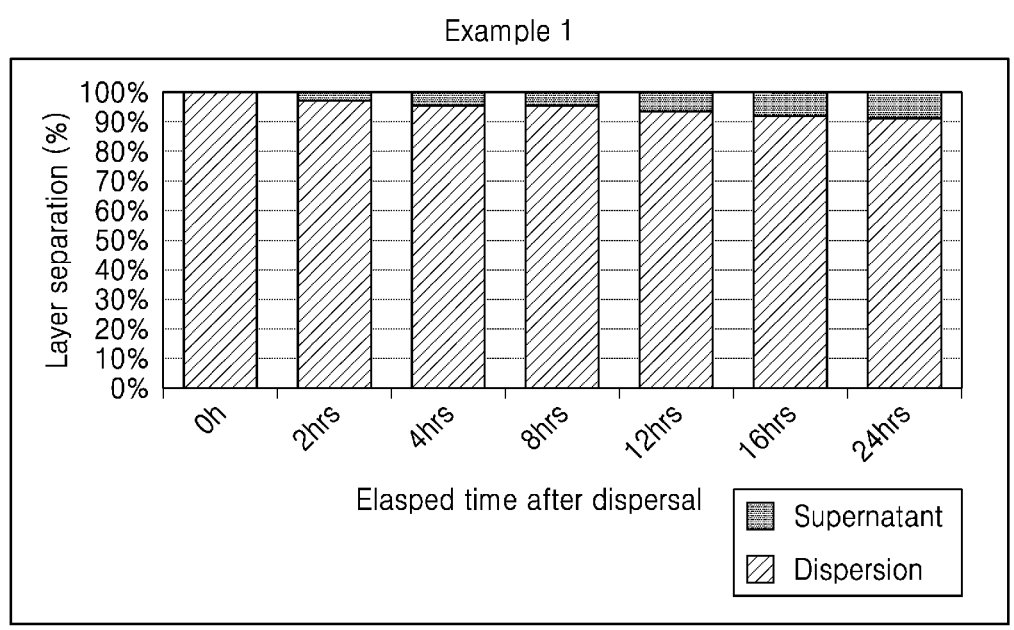

As shown in FIGS. 2A and 2B, the ink composition of Example 1 was found to have improved dispersion stability of the light-emitting device in the composition, as compared with the ink composition of Comparative Example 1 not containing an organic thickener.

As apparent from the foregoing description, the ink composition may have excellent dispersion stability, and thus, the ink composition is easy to be stored and has excellent ejection stability. Accordingly, a thin film in which light-emitting devices are uniformly aligned may be provided when manufacturing a thin film using a solution process.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. An ink composition comprising:

a light-emitting device;

a solvent; and an organic thickener, wherein the solvent comprises at least one selected from diethylene glycol monoalkyl ether solvent, diethylene glycol dialkyl ether solvent, triethylene glycol monoalkyl ether solvent, triethylene glycol dialkyl ether solvent, and alkylene glycol alkyl ether acetate solvent, and the organic thickener is a polymeric compound comprising:
a polyurea unit; and
at least one group represented by Formula 1:

<Formula 1> wherein in Formula 1,
X is a single bond or a divalent organic linking group,
$R_1$ is a substituted or unsubstituted $C_1$-$C_{10}$ alkylene group,
$R_2$ is selected from hydrogen, deuterium, a hydroxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, and a substituted or unsubstituted $C_1$-$C_{60}$ alkyl ether group,
n1 is an integer from 2 to 100, and
* indicates a binding site of the polymeric compound.

2. The ink composition of claim 1, wherein the organic thickener comprises the at least one group represented by Formula 1 in at least one selected from a side chain of the polymeric compound and a terminus of the polymeric compound.

3. The ink composition of claim 1, wherein the organic thickener comprises the at least one group represented by Formula 1 in a terminus of the polymeric compound.

4. The ink composition of claim 1, wherein in Formula 1, $R_2$ is a $C_1$-$C_{20}$ alkyl group in which a hydroxyl group is substituted at a terminus or a $C_1$-$C_{20}$ alkyl ether group in which a hydroxyl group is substituted at a terminus.

5. The ink composition of claim 1, wherein in Formula 1, $R_2$ is a group represented by Formula 2:

<Formula 2> wherein in Formula 2,
$R_{21}$ is a substituted or unsubstituted $C_1$-$C_{10}$ alkylene group,
m1 is an integer from 1 to 10, and
* indicates a binding site to an adjacent atom.

6. The ink composition of claim 1, wherein the organic thickener is a polymeric compound further comprising at least one group represented by Formula 3:

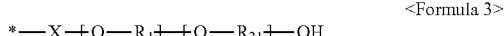

<Formula 3> wherein in Formula 3,
X is a single bond or a divalent organic linking group,
$R_1$ and $R_{21}$ are each independently a substituted or unsubstituted $C_1$-$C_{10}$ alkylene group,
n1 is an integer from 2 to 100,
m1 is an integer from 1 to 10, and
* indicates a binding site of the polymeric compound.

7. The ink composition of claim 1, wherein
a number average molecular weight (Mn) of the organic thickener is in a range of about 100 to about 100,000, and a weight average molecular weight (Mw) of the organic thickener is in a range of about 1,500 to about 1,000,000.

8. The ink composition of claim 1, wherein the light-emitting device comprises:
a first semiconductor layer;
a second semiconductor layer; and
an active layer between the first semiconductor layer and the second semiconductor layer.

9. The ink composition of claim 8, wherein the light-emitting device further comprises:
a first electrode layer under the first semiconductor layer; and
a second electrode layer over the second semiconductor layer.

10. The ink composition of claim 1, wherein the light-emitting device has a cylindrical shape.

11. The ink composition of claim 1, wherein
a diameter of the light-emitting device is in a range of about 0.1 micrometers (µm) to about 1 µm, and
a length of the light-emitting device is in a range of about 1 µm to about 10 µm.

12. The ink composition of claim 1, wherein the solvent comprises a functional group that is hydrogen-bonded to the organic thickener.

13. The ink composition of claim 1, wherein a content of the organic thickener is in a range of about 0.05 percent by weight (wt %) to about 1 wt %, based on the total weight of the ink composition.

14. The ink composition of claim 1, wherein a content of the light-emitting device is in a range of about 0.01 wt % to about 1 wt %, based on the total weight of the ink composition.

15. The ink composition of claim 1 further comprising a dispersant,
wherein a content of the dispersant in the ink composition is in a range of about 10 parts to about 50 parts by weight, based on 100 parts by weight of the light-emitting device.

16. The ink composition of claim 1, wherein
a viscosity at a shear rate of 0.1 reciprocal seconds ($s^{-1}$) is in a range of about 30 centipoises (cP) to about 1,000 cP, and
a viscosity at a shear rate of 100 $s^{-1}$ is in a range of about 7 cP to about 13 cP.

17. A method of manufacturing a light-emitting apparatus, the method comprising:
providing a substrate comprising an emission area in which a first electrode and a second electrode are spaced apart from each other;
providing the ink composition of claim 1 onto the emission area to input the light-emitting device in the emission area; and
arranging the light-emitting device at an area of the first electrode and at an area of the second electrode to dispose the light-emitting device between the first electrode and the second electrode.

18. The method of claim 17, wherein the providing of the ink composition onto the emission area is performed by an inkjet printing method.

19. The ink composition of claim 1, wherein the polymeric compound further comprises:
at least one selected from a polyurethane unit and a polyamide unit.

* * * * *